(12) United States Patent
Mathai et al.

(10) Patent No.: US 10,120,149 B1
(45) Date of Patent: Nov. 6, 2018

(54) WAVELENGTH DIVISION MULTIPLEXING (WDM) OPTICAL MODULES

(71) Applicant: HEWLETT PACKARD ENTERPRISE DEVELOPMENT LP, Houston, TX (US)

(72) Inventors: Sagi Mathai, Sunnyvale, CA (US); Wayne Victor Sorin, Mountain View, CA (US); Michael Renne Ty Tan, Menlo Park, CA (US); Paul Kessler Rosenberg, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/649,073

(22) Filed: Jul. 13, 2017

(51) Int. Cl.
*G02B 6/42* (2006.01)
*G02B 6/28* (2006.01)
*G02B 6/293* (2006.01)
*H04J 14/02* (2006.01)

(52) U.S. Cl.
CPC .......... *G02B 6/425* (2013.01); *G02B 6/2938* (2013.01); *G02B 6/29365* (2013.01); *G02B 6/4206* (2013.01); *G02B 6/4208* (2013.01); *G02B 6/428* (2013.01); *G02B 6/4214* (2013.01); *G02B 6/4246* (2013.01); *G02B 6/4269* (2013.01); *G02B 6/4286* (2013.01); *H04J 14/02* (2013.01)

(58) Field of Classification Search
CPC ...... G02B 6/425; G02B 6/428; G02B 6/2938; G02B 6/4214
See application file for complete search history.

(56) References Cited

U.S. PATENT DOCUMENTS

| | | | |
|---|---|---|---|
| 7,298,941 | B2 | 11/2007 | Palen et al. |
| 8,532,155 | B2 | 9/2013 | Takaki et al. |
| 2016/0266322 | A1 | 9/2016 | Epitaux et al. |

*Primary Examiner* — Jerry Rahll
(74) *Attorney, Agent, or Firm* — Hewlett Packard Enterprise Patent Department

(57) ABSTRACT

Examples herein relate to a Wavelength Division Multiplexing (WDM) optical module configured for M optical fibers, N WDM wavelengths and M×N optical signals. The module comprises an active silicon interposer, the interposer comprises a (M/2)×N array of photodetectors established on a front side of the interposer and N chips for the N WDM wavelengths. Each chip comprises M lenses for M optical signals, the M lenses established on a back side of a GaAs substrate, the M lenses comprising a first group of M/2 lenses to focus M/2 optical input signals onto M/2 photodetectors of the (M/2)×N array, and a second group of M/2 lenses to collimate M/2 optical output signals, and M/2 Vertical Cavity Surface Emitting Lasers (VCSELs) established on a front side of the GaAs substrate to generate the M/2 optical output signals.

20 Claims, 6 Drawing Sheets

WAVELENGTH DIVISION MULTIPLEXING (WDM) OPTICAL MODULES

BACKGROUND

Silicon photonics (SiPh) is the study and application of photonic systems which use silicon as an optical medium. The silicon is usually patterned with precision into microphotonic components in such a way as to achieve a desired functionality. An interposer serves as a substrate on which multiple components and devices are interconnected and interfaced with external substrates. Lenses established on a substrate may permit focusing and collimating optical signals.

BRIEF DESCRIPTION OF THE DRAWINGS

In Wavelength Division Multiplexing (WDM) optical modules, transmitters and receivers may be implemented in different chips. The proposed solution permits an optimum use of area due to integration of lenses for receivers and transmitters on the same chip on a GaAs substrate. In fiber-optic communications, wavelength-division multiplexing (WDM) is a technology which multiplexes a number of optical carrier signals onto a single optical fiber by using different wavelengths (i.e., colors) of laser light. The following detailed description references the drawings, wherein.

DETAILED DESCRIPTION

Figure 1:
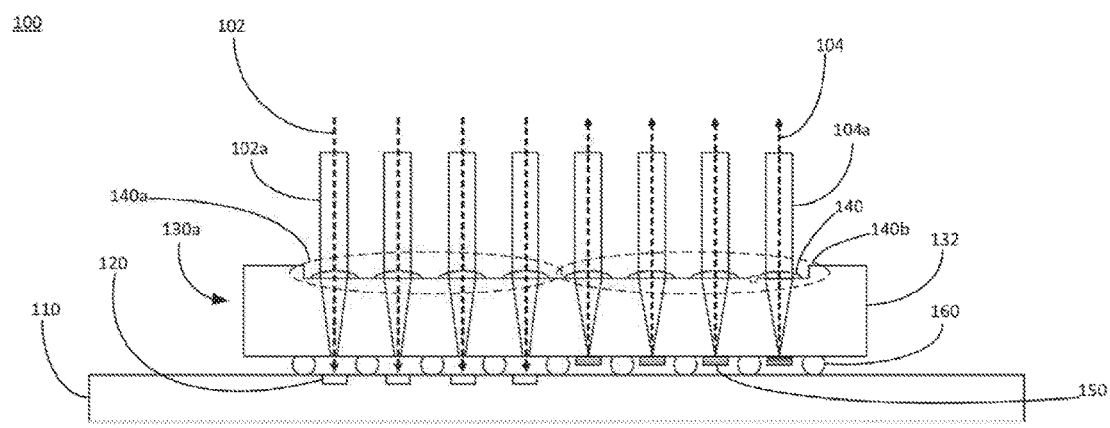
FIG. 1 illustrates a front view of an example of a WDM optical module according to the present disclosure.

FIG. 1 shows a front view of an example of a WDM optical module 100 according to the present disclosure. The optical module 100 is built for 8 optical fibers with 4 WDM wavelengths and a total of 32 optical signals. Each optical fiber can transmit four optical signals, each optical signal can have a different wavelength ($\lambda1$, $\lambda2$, $\lambda3$, $\lambda4$) e.g. each optical signal can represent a WDM channel. In the present disclosure, the integer M may represent a number of optical fibers which may be equal to a number of lenses. The integer N may represent a number of WDM wavelengths. Hence, for the example of FIG. 1, M can be equal to 8 and N equal to 4. In FIG. 1, 4 optical fibers can transmit 4 input optical signals 102 into the optical module 100 and 4 optical fibers can transmit 4 output optical signals 104 from the optical module 100.

The optical module 100 comprises an active silicon interposer 110. The general purpose of an interposer can be to copackage multiple components. Passive and active optical elements, such as but not limited to grating couplers, waveguides, modulators, and photodetectors, can be fabricated on the interposer 110 to in or out couple, route, modulate, and detect optical signals, respectively. The interposer 110 comprises an array of 16 photodetectors 120 established on a front side of the interposer 110. The photodetectors operates by converting incoming optical signals that hit the junction to a voltage or current. The optical module 100 comprises 4 chips, each chip being configured for a specific WDM wavelength. Hence, the module 100 comprises a first chip 130a for $\lambda1$ wavelength, a second chip 130b for $\lambda2$ wavelength (not shown), a third chip 130c for $\lambda3$ wavelength (not shown) and a fourth chip 130d for $\lambda4$ wavelength (not shown). FIG. 1 shows the chip 130a for the $\lambda1$ wavelength.

Each chip comprises 8 lenses for the 8 optical signals, i.e. 4 input optical signals 102 and 4 output optical signals 104. The 8 lenses can be established on a back side of a GaAs substrate or wafer 132. A wafer, also called a slice or substrate, is a thin slice of semiconductor material, such as a crystalline silicon, used in electronics for the fabrication of integrated circuits and in photovoltaics for conventional, wafer-based solar cells. Furthermore, each chip 130 comprises 4 Vertical Cavity Surface Emitting Lasers (VCSELs) 150 established on a front side of the GaAs substrate 132. The vertical-cavity surface-emitting laser, or VCSEL 150 is a type of semiconductor laser diode with laser beam emission perpendicular to the top surface of the wafer. The front side of the GaAs substrate can be bonded to the front side of the active silicon interposer 110 with solder bond, such as bumps 160.

For the 4 optical input signals 102 from the 8 optical signals for each chip 130, a first group of 4 lenses 140a focuses the 4 optical input signals 102 for the $\lambda1$ wavelength and 4 photodetectors 120 from the array of 16 photodetectors are configured to detect the focused 4 optical input signals 102.

For the 4 optical output signals 104 for each chip 130, 4 VCSELs 150 are configured to emit the 4 optical output signals 104 and a second group of 4 lenses 140b collimates the emitted 4 optical output signals 104.

Figure 2:
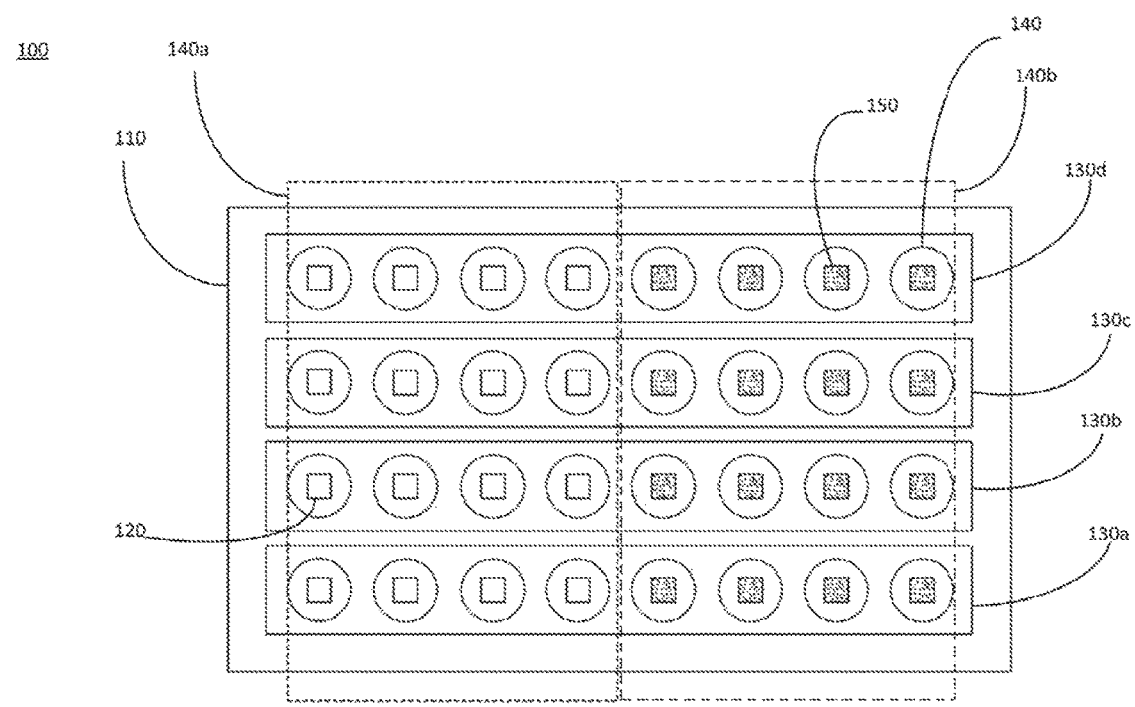
FIG. 2 illustrates a top view of the example of the WDM optical module according to the present disclosure.

FIG. 2 shows a top view of the example of the WDM optical module 100 shown in FIG. 1. The top view shows the four chips 130a to 130d for the wavelengths $\lambda1$, $\lambda2$, $\lambda3$ and $\lambda4$, respectively. The four chips are bonded on the silicon active interposer 110 as previously mentioned in FIG. 1. In particular each chip 130 comprises eight lenses 140 and four VCEL's 150. In total the module 100 comprises a group (or 4×4 array) of 16 photodetectors and a group (or 4×4 array) of 16 VCSELs. The first group 140a of 16 lenses 140 focuses 16 optical input signals and the second group 140b of 16 lenses 140 collimates 16 emitted optical output signals. In one implementation the group of 16 photodetectors can be avalanche photodiodes (APD). A photodetector can be defined as a highly sensitive semiconductor device that converts light to electricity. APDs can be a photodetector that provides a built-in first stage of gain through avalanche multiplication. Other types of photodetectors that could be used to implement the proposed optical modules are surface illuminated photodetectors, waveguide photodiodes, metal semiconductor metal photodetectors, etc.

Figure 3:
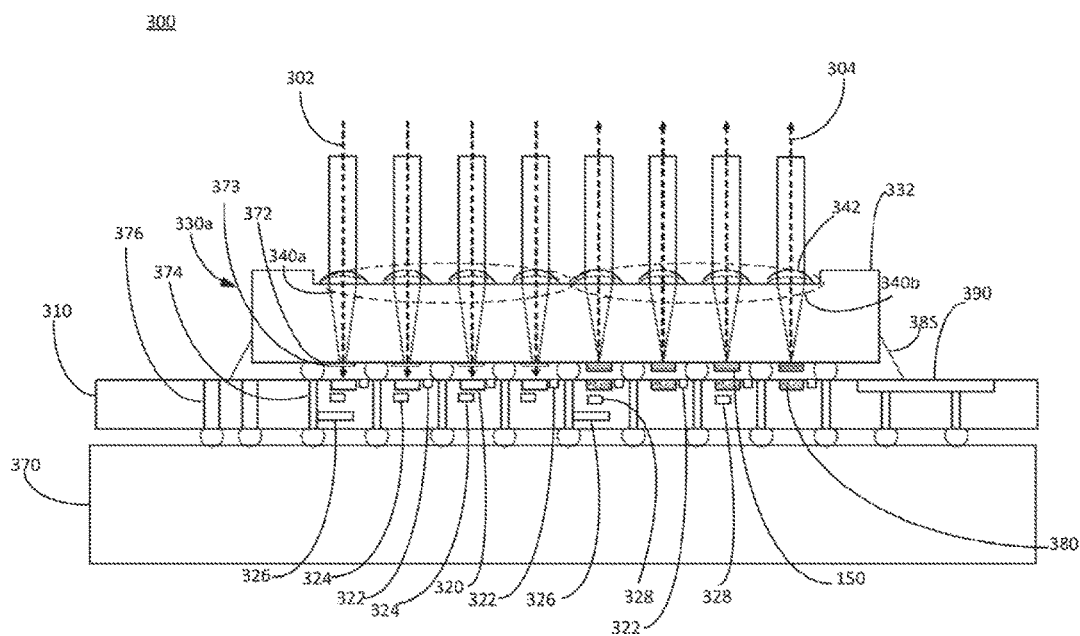
FIG. 3 illustrates a front view of an example of a WDM optical module according to the present disclosure.

FIG. 3 shows a front view of another example of an optical module 300 according to the present disclosure. The optical module 300 is built for 8 optical fibers wherein 4 optical fibers transmit 4 input optical signals 302 into the optical module 300 and wherein 4 optical fibers transmit 4 output optical signals 304 from the optical module 300 for each chip. In this example, a chip 330a comprises four antireflection (AR) coated surfaces 372 established on the front side of the GaAs substrate 332 and along the optical path between a first group of four lenses 340a and the 4 photodetectors 320. The GaAs substrate 332 can be substantially transparent at wavelengths larger than 900 nm in comparison with other types of substrate avoiding optical loss and light refraction. Alternatively, the AR coating may continuously cover all or a substantial portion of the front side of the GaAs substrate 332. In other implementations lenses may be formed at the location of the AR coated surfaces 372.

The four photodetectors 320 may be powered by four DC bias connections 322 as e.g. resistor, capacitors and inductors. Furthermore, each of the four AR coated surfaces 372 can comprise a VCSEL epi material. The VCSEL epi material may be partially or completely removed from the GaAs substrate 332 in order to prevent optical loss to incoming light 302. Epi substrates or epi wafers are wafers of semiconducting material made by epitaxial growth for use in photonics, microelectronics or photovoltaics. In alternative implementations, a semiconductor optical amplifier (SOA) may be established in the location of the AR coated surface 371 to amplify the incoming signals.

The epi layer may be the same material as the substrate, typically GaAs, or it may be a more exotic material with specific desirable qualities such as AlGaAs, InGaAs, GaAsP, etc. In one implementation, the VCSEL aperture can be precisely set by photolithography. Photolithography is a process used in microfabrication to pattern parts of a thin film or the bulk of a substrate. It uses light to transfer a geometric pattern from a photomask to a light-sensitive chemical "photoresist", or simply "resist," on the substrate. In this implementation the VCSELs 150 can be biased by four DC bias circuits 322. Furthermore, each of the 8 lenses 340a and 340b comprised in the chip 330a and other lenses from the rest of the chips can comprise an additional antireflection (AR) coated surface 342 established on a top surface of each lens. In one implementation the lenses can be precisely set by photolithography. The lenses may have substantially the same shape or different shapes to optimize their performance with respect to the light emitting by the VCSELs 150 and received by the photodetectors 320.

The active silicon interposer 310 comprises a 4×4 array of laser diode drivers (LDD) 380 established on the front side of the interposer 310. A LDD can deliver exactly the electrical modulation signals the laser diode requires to transmit high speed optical signals. The LDD can drive current to the laser diode safely and at an appropriate level. FIG. 3 shows 4 LDDs 380 corresponding to the drivers of the chip 330a. For the 4 optical output signals 304b and for the chip 330a, the 4 LDDs 380 of the array of LDD's can be configured to provide electrical signals to the 4 VCSEL's 150. In other implementations, the LDD also delivers the DC bias required by the laser diode to operate.

Furthermore, the active silicon interposer 310 comprises a 4×4 array of transimpedance amplifiers (TIA) (four TIA 324 are shown in FIG. 3) connected to the 4×4 array of photodetectors (4 photodetectors 320). A TIA is a current-to-voltage converter. The TIA's 324 can be used to amplify the current output of the photo detectors 320 to a usable voltage. Technologies as e.g. CMOS, BiCMOS, SiGe, etc. can be implemented to achieve an optimum TIA and LDD performance. The use of these technologies may minimize the distance between TIA and LDD, and photodetectors and laser diodes, respectively, improving impedance matching, DC bias delivery, signal integrity and power consumption. In this implementation, the active silicon interposer 310 comprises two impedance matching circuits 326 to match the impedance of the (M/2)×N array of LDDs 380 and the (M/2)×N array of TIAs 324 to electrical traces comprised on the organic substrate 370. In some implementations, the interposer 310 can comprise more than two impedance matching circuits 326, e.g. an impedance matching circuit for each LDD and TIA.

Furthermore, the active silicon interposer 310 can comprise a plurality of optical power monitors 328 for one or even more VCSEL's biased by the DC bias circuits 322. In this particular implementation the interposer 310 comprises two optical power monitors 328. The optical power monitors 328 (e.g. made of Ge, Si, poly-Si or SiGe) can be used to measure the optical power emitted by at least one VCSEL per chip 332 and provide a feedback signal to the associated LDD's 380 in the event the laser power reduces due to aging. Furthermore, the active silicon interposer 310 further comprises a temperature sensor 390 (e.g. a metal, poly-Si, or Si temperature sensor) that may provide a feedback signal to the LDDs 380 and TIAs 324 to optimize the performance of the optical link and avoid the harming of the components comprised in and on the interposer 310 due to overheating. The feedback signals may also be sent to a system management layer to optimize external cooling of the module.

Furthermore, the active silicon interposer 310 further comprises thermal shunts for heat dissipation, thermal oxidized regions and air trenches and through holes for thermal isolation represented by reference 376 and through-silicon via (TSV) 374 to receive electrical input and transmit electrical output through the interposer 310. Furthermore, the optical module 300 comprises a transparent optical underfill 385 with an appropriate refractive index to eliminate optical reflections between the GaAs substrate 332 and active silicon interposer 310

Figure 4:
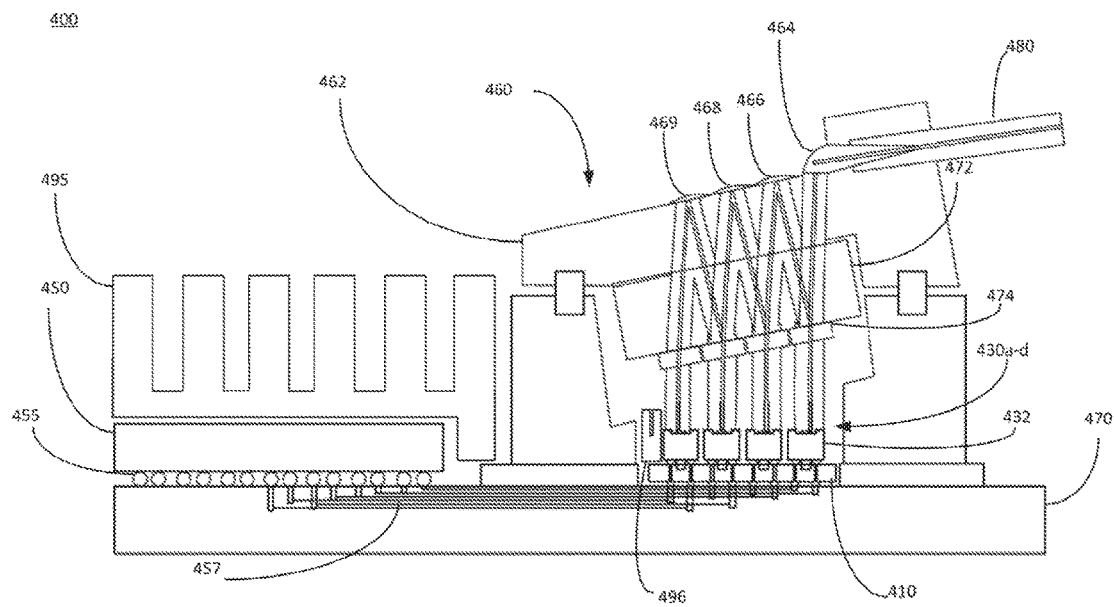
FIG. 4 illustrates a front view of an example of a WDM optical module according to the present disclosure.

FIG. 4 shows an example of an optical module 400 according to the present disclosure. The example of the optical module 400 is built for M optical fibers 480 with N WDM wavelengths and a total of M×N optical signals. Each optical fiber can transmit four optical signals, each optical signal can have a different wavelength ($\lambda 1, \lambda 2, \lambda 3, \lambda 4$) e.g. each optical signal can represent a WDM channel. The optical module 400 comprises an organic substrate 470, an active silicon interposer 410 bonded on the organic substrate 470 and an integrated chip (IC) 450 also bonded on the organic substrate 470 by solder bumps 455 that can be precisely aligned using photolithography. The IC 450 can be configured to receive electrical input from an array of TIAs (shown in previous FIG. 3) connected to electrical traces 457 and transmit electrical output to an array of LDD's (shown in previous FIG. 3) by electrical traces 457. Furthermore, the optical module 400 comprises four chips 430a to 430d having a GaAs substrate 432 as previously shown in FIG. 2.

The optical module 400 further comprises an optical connector assembly 460, the optical connector assembly 460 comprises an optical ferrule 462 that can be connected (e.g. pigtailed) to the M optical fibers 480 transmitting the M×N optical signals. E.g. each optical fiber can transmit N optical signals with different wavelengths ($\lambda 1$ to $\lambda 4$). The assembly 460 further comprises a turning mirror 464 adapted to turn the optical signals from the optical fibers 480 on a predetermined direction and three relay mirrors 466, 468 and 469 adapted to relay the optical signals transmitted by the optical fibers 480. The turning mirror 464 and the three relay mirrors 466, 468 and 469 (or even more) may permit to direct the transmitted optical signals into a plurality of WDM filers 474 as shown in FIG. 4.

The optical module 400 further comprises a multiplexer/demultipexer configured to multiplex/demultiplex the M×N optical signals for the 4 WDM wavelengths $\lambda 1, \lambda 2, \lambda 3$ and $\lambda 4$. The module 400 also comprises a WDM filter array 474 for each WDM wavelength, each WDM filter 474 can be configured to pass the optical signals of a particular WDM channel according to the specific WDM wavelength. A WDM filter purpose is to separate a single channel's signal for a particular wavelength from a group of optical signals with different wavelengths. This is realized by allowing the wavelengths of light corresponding to a particular WDM channel to pass while all others are reflected. The optical module 400 can comprise at least one heat sink. A heat sink can be in thermal communication with at least one of the silicon interposer 410, the IC 450 and the lens array chips 430a to 430d and can improve thermal management of active devices. In this preferred example, the IC 450 may have a separate heat sink 495 apart from the active silicon interposer 410 that comprises a further heat sink 496 in order to prevent the IC 450 from transferring its heat to the silicon interposer.

In this example, each chip 430a to 430d also comprises antireflection (AR) coated surfaces established on the front side of the GaAs substrate 432 and along the optical path between a first group of four lenses on the GaAs substrate 432 and a group of photodetectors on the interposer 410 from a total array of photodetectors. In other implementations, each of the AR coated surfaces can comprise a SOA established in the location of the AR coated surface to amplify the incoming optical signals. The GaAs substrate 432 can be also substantially transparent at wavelengths larger than 900 nm in comparison with other types of substrate avoiding optical loss.

The active silicon interposer 410 can comprise an array of optical power monitors for monitoring one or even more VCSEL's that can be biased by the DC bias circuits. Furthermore, the active silicon interposer 410 can comprise an array of laser diode drivers (LDD) established on the front side of the interposer 410. The LDD can drive current to the laser diode safely and at an appropriate level. For the optical output signals and for each chip 430a to 430d, the array of LDD's can be configured to provide electrical signals to the array of VCSEL's. The optical power monitors (e.g. made of Ge, Si, poly-Si or SiGe) can be used to measure the optical power emitted by at least one VCSEL and provide a feedback signal to the associated LDD's 480 in the event the laser power reduces due to aging.

The VCSEL epi material may be partially or completely removed from the GaAs substrate 432 in order to prevent optical loss to incoming light. Furthermore, each of the lenses comprised in chips 430a to 430d can comprise an additional antireflection (AR) coated surface established on a top surface of each lens. The lenses may have substantially the same shape or different shapes to optimize their performance with respect to the light emitting by the array of VCSELs and received by the array of photodetectors.

Furthermore, the active silicon interposer 410 can comprise an array of TIA's connected to the array of photodetectors. The array of TIA's can be used to amplify the current output of the photodetectors to a usable voltage. In this implementation, the active silicon interposer 410 can comprise several impedance matching circuits to match the impedance of the array of LDDs and the array of TIA's to electrical traces comprised on the organic substrate 470.

Figure 5:
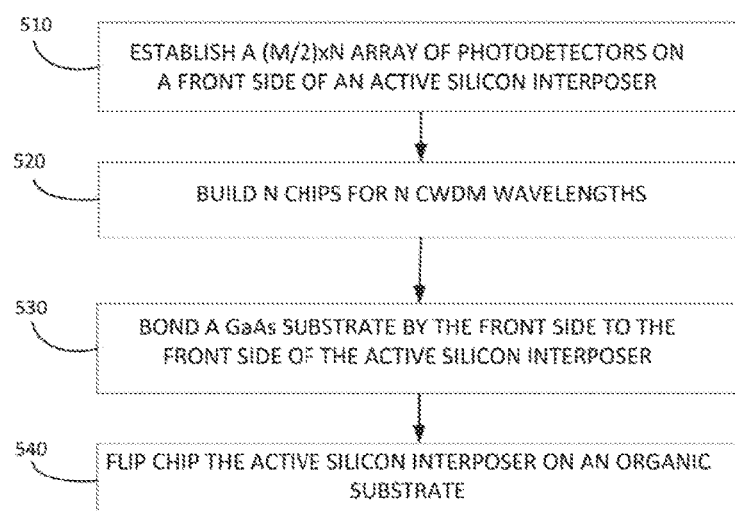
FIG. 5 illustrates an example of a flowchart for fabricating a WDM optical module according to the present disclosure.

FIG. 5 shows an example of a block diagram 500 for fabricating a Wavelength Division Multiplexing (WDM) optical module configured according to FIG. 1 to FIG. 4 for M optical fibers, N WDM wavelengths and M×N optical signals. The diagram 500 comprises a step 510 for establishing a (M/2)×N array of photodetectors on a front side of an active silicon interposer. The diagram 500 comprises step 520 for building N chips for the N WDM wavelengths. For each chip, the following can be performed:

A step for establishing M lenses for the M optical signals on a back side of a GaAs substrate and a step for establishing M/2 Vertical Cavity Surface Emitting Lasers (VCSELs) on a front side of the GaAs substrate. In one implementation, the M lenses for each chip may comprise an antireflection (AR) coated surface. In alternate implementations, the M lenses may comprise, but are not limited to, a high contrast grating, a diffractive lens, an offset lens, or a lens section.

Furthermore, the diagram 500 comprises a step 530 for bonding the GaAs substrate by the front side to the front side of the active silicon interposer with a self-aligned solder reflow process. The solder reflow process may be followed by an underfill process. In step 540, the active silicon interposer is flip chipped on an organic substrate with e.g. solder reflow.

In another implementation, the diagram 500 may comprise a step for establishing on each chip M/2 AR coated surfaces on the front side of the GaAs substrate and along the optical path between a first group of M/2 lenses and M/2 photodetectors. For each chip receiving M/2 optical input signals, the first group of M/2 lenses can be configured to focus the M/2 optical input signals. Furthermore, the M/2 photodetectors can be configured to detect the focused M/2 optical input signals.

The diagram 500 may comprise a step for establishing a (M/2)×N array of laser diode drivers (LDD) on the front side of the interposer. For each chip transmitting M/2 optical output signals from the M signal, M/2 VCSELs may be configured to emit the M/2 optical output signals. The emitted M/2 optical output signals may be collimated with a second group of M/2 lenses. Furthermore, M/2 LDD's of the array may provide electrical signals to the M/2 VCSEL's.

The diagram 500 may comprise a step for establishing a (M/2)×N array of transimpedance amplifiers (TIA) associated with the (M/2)×N array of photodetectors on the interposer.

The diagram 500 may comprise a step for establishing an optical power monitor for one or more LDD's of the (M/2)×N array of LDD's on the active silicon interposer for power monitoring. The diagram 500 may comprise a step for flip chipping an integrated chip (IC) on the organic substrate. The IC can be configured to receive electrical input from the (M/2)×N array of TIAs by TSVs (through-silicon via) and electrical traces and transmit electrical output to the (M/2)×N array of laser diode drivers (LDD) by electrical traces and TSVs.

The diagram 500 may comprise a step for establishing an optical connector assembly on the organic substrate, the optical connector comprising means for plugging M optical fibers transmitting the M×N optical signals at specific wavelengths, turning the M×N optical signals and relaying the M×N optical signals. In another implementation, the diagram 500 can further comprise multiplexing/demultiplexing the M×N optical signals for each of the N WDM wavelengths and filtering the M×N optical signals by establishing a WDM filter for each WDM wavelength. In another implementation, at least one heat sink to the interposer can be attached.

Figure 6:
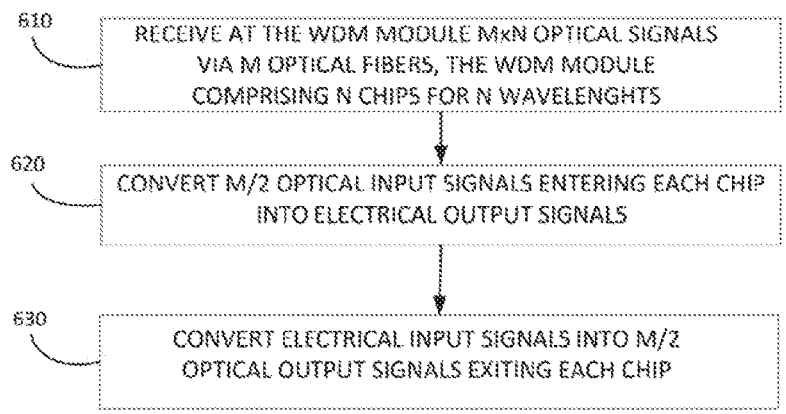
FIG. 6 illustrates an example of a flowchart for operating a WDM optical module according to the present disclosure.

FIG. 6 shows an example of a block diagram 600 for operating a Wavelength Division Multiplexing (WDM) optical module configured for M optical fibers, N CWDM wavelengths and M×N optical signals. The block diagram 600 comprises a block 610 for receiving at the WDM optical module M×N optical signals via M optical fibers.

The WDM optical module can correspond to the examples of WDM optical modules show in FIGS. 1 to 4. The WDM optical module can comprise an active silicon interposer having a (M/2)×N array of photodetectors (e.g. reference 120 in FIG. 1) established on a front side of the interposer and a chip for each WDM wavelength (e.g. reference 132 in FIG. 1).

Each chip can receive a particular wavelength from the group of N wavelengths. Furthermore, each chip can comprise M lenses for M optical signals, the M lenses can be established on a back side of a GaAs substrate. In an implementation, the M lenses can comprise a first group of M/2 lenses to focus M/2 optical input signals entering the chip and a second group of M/2 lenses to collimate M/2 optical output signals exiting the chip.

Furthermore, the diagram 600 can comprise a block 620 for converting the M/2 optical input signals entering each chip into electrical output signals by means of M/2 photodetectors of the (M/2)×N array and a block 630 for converting electrical input signals into the M/2 optical output signals exiting each chip by means of M/2 Vertical Cavity Surface Emitting Lasers (VCSELs) established on a front side of the GaAs substrate.

In some implementations, the diagram 600 can comprise a block for transmitting the electrical output signals from the interposer to an integrated chip (IC) comprised in the WDM optical module and a further block for receiving the electrical input signals for each chip from the IC.

In some implementations, the diagram 600 can comprise a block for multiplexing and demultiplexing the M×N optical signals for each of the N WDM wavelengths and a further block for filtering the M×N optical signals by establishing a WDM filter for each WDM wavelength. In this respect, each WDM filter can be configured to pass optical signals with a unique wavelength from the N WDM wavelengths.

Furthermore, relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A Wavelength Division Multiplexing (WDM) optical module configured for M optical fibers, N WDM wavelengths and M×N optical signals, the module comprising:
an active silicon interposer, the interposer comprising:
a (M/2)×N array of photodetectors established on a front side of the interposer, and
N chips for the N WDM wavelengths, each chip comprising:
M lenses for M optical signals, the M lenses established on a back side of a GaAs substrate, the M lenses comprising a first group of M/2 lenses to focus M/2 optical input signals onto M/2 photodetectors of the (M/2)×N array, and a second group of M/2 lenses to collimate M/2 optical output signals, and
M/2 Vertical Cavity Surface Emitting Lasers (VCSELs) established on a front side of the GaAs substrate to generate the M/2 optical output signals.

2. The WDM optical module of claim 1, further comprising an organic substrate, wherein the back side of the active silicon interposer is bonded to the organic substrate, and wherein the front side of the GaAs substrate is bonded to the front side of the active silicon interposer with solder reflow.

3. The WDM optical module of claim 1, wherein each chip comprises:
M/2 antireflection (AR) coated surfaces established on the front side of the GaAs substrate and along the optical path between the first group of M/2 lenses and the M/2 photodetectors;
M/2 semiconductor optical amplifiers (SOA) established in the location of the M/2 antireflection (AR) coated surfaces; and
an additional AR coated surface established on a top side of each of the M lenses.

4. The WDM optical module of claim 2, wherein each of the M/2 coated surfaces comprises a VCSEL epi material or GaAs substrate.

5. The WDM optical module of claim 4, wherein the active silicon interposer further comprises at least one optical power monitor for one or more VCSELs of the (M/2)×N array of VCSELs, the at least one optical power monitor being biased by one or more DC bias circuits.

6. The WDM optical module of claim 4, further comprising an integrated chip (IC) bonded on the organic substrate, wherein the IC is configured to:
receive electrical input from the (M/2)×N array of TIAs with through-silicon via (TSVs) and electrical traces; and
transmit electrical output to the (M/2)×N array of laser diode drivers (LDD) with electrical traces and TSVs.

7. The WDM optical module of claim 6, further comprising at least one heat sink attached to the IC and at least one heat sink attached to the interposer.

8. The WDM optical module of claim 1, wherein the active silicon interposer further comprises one or more temperature sensors.

9. The WDM optical module of claim 1, wherein the (M/2)×N array of photodetectors are avalanche photodiodes (APD).

10. The WDM optical module of claim 1, further comprising an optical connector assembly, the optical connector assembly comprising:
an optical ferrule connected to M optical fibers transmitting the M×N optical signals;
a turning mirror adapted to turn the M×N optical signals; and
N−1 relay mirrors adapted to relay the M×N optical signals.

11. The WDM optical module of claim 1, further comprising:
a multiplexer/demultipexer configured to multiplex/demultiplex the M×N optical signals for each of the N WDM wavelengths;
a WDM filter for each WDM wavelength, each WDM filter configured to pass optical signals with a unique wavelength from the N WDM wavelengths; and
an index matched optically transparent underfill between the N chips for the N WDM wavelengths and the active silicon interposer.

12. The WDM optical module of claim 1, wherein the active silicon interposer further comprises:

a (M/2)×N array of laser diode drivers (LDD) established on the front side of the interposer, wherein for the M/2 optical output signals and for each chip:
  M/2 LDDs of the array are to provide electrical signals to the M/2 VCSELs;
  a (M/2)×N array of transimpedance amplifiers (TIA) connected to the (M/2)×N array of photodetectors;
  a plurality of DC bias circuits to bias the M/2 VCSELs for each chip and the (M/2)×N array of photodetectors; and
  a plurality of impedance matching circuits to match the impedance of the (M/2)×N array of LDDs and the (M/2)×N array of TIAs to electrical traces comprised on the organic substrate.

13. A method comprising:
establishing a (M/2)×N array of photodetectors on a front side of an active silicon interposer;
building N chips for N Wavelength Division Multiplexing wavelengths by, for each chip:
  establishing M lenses for the M optical signals on a back side of a GaAs substrate, and
  establishing M/2 Vertical Cavity Surface Emitting Lasers (VCSELs) on a front side of the GaAs substrate.

14. The method of claim 13, further comprising:
bonding the GaAs substrate by the front side to the front side of the active silicon interposer; and
  flip chipping the active silicon interposer on an organic substrate.

15. The method of claim 14, further comprising:
establishing an optical connector assembly on the organic substrate, the optical connector comprising means for:
  plugging M optical fibers transmitting the M×N optical signals;
  turning the M×N optical signals;
  relaying the M×N optical signals;
  multiplexing/demultiplexing the M×N optical signals for each of the N WDM wavelengths; and
  filtering the M×N optical signals by establishing a WDM filter for each WDM wavelength.

16. The method of claim 13, further comprising:
establishing a (M/2)×N array of laser diode drivers (LDD) on the front side of the interposer, wherein for M/2 optical output signals from the M signals and for each chip:
configuring M/2 VCSELs to emit the M/2 optical output signals; and
collimating the emitted M/2 optical output signals with a second group of M/2 lenses,
wherein M/2 LDDs of the array provides electrical signals to the M/2 VCSELs; and
establishing a (M/2)×N array of transimpedance amplifiers (TIA) associated with the (M/2)×N array of photodetectors on the interposer.

17. The method of claim 16, further comprising:
establishing an optical power monitor for one or more VCSELs of the (M/2)×N array of VCSELs on the active silicon interposer;
flip chipping an integrated chip (IC) on the organic substrate, wherein the IC is configured to:
  receive electrical input from the (M/2)×N array of TIA with TSVs (through-silicon via) and electrical traces; and
  transmit electrical output to the (M/2)×N array of laser diode drivers (LDD) with electrical traces and TSVs.

18. A method comprising:
receiving at the WDM optical module M×N optical signals via M optical fibers, the WDM optical module comprising:
  an active silicon interposer comprising a (M/2)×N array of photodetectors established on a front side of the interposer, and
  a chip for each WDM wavelength, each chip comprising:
    M lenses for M optical signals, the M lenses established on a back side of a GaAs substrate, the M lenses comprising a first group of M/2 lenses to focus M/2 optical input signals and a second group of M/2 lenses to collimate M/2 optical output signals;
  converting the M/2 optical input signals entering each chip into electrical output signals by means of M/2 photodetectors of the (M/2)×N array; and
  converting electrical input signals into the M/2 optical output signals exiting each chip by means of M/2 Vertical Cavity Surface Emitting Lasers (VCSELs) established on a front side of the GaAs substrate.

19. The method of claim 18, further comprising:
transmitting the electrical output signals from the interposer to an integrated chip (IC) comprised in the WDM optical module, and
receiving the electrical input signals for each chip from the IC.

20. The method of claim 18, further comprising:
multiplexing/demultiplexing the M×N optical signals for each of the N WDM wavelengths; and
filtering the M×N optical signals by establishing a WDM filter for each WDM wavelength, wherein each WDM filter is configured to pass optical signals with a unique wavelength from the N WDM wavelengths.

* * * * *